United States Patent
Ong et al.

(10) Patent No.: US 8,182,319 B2
(45) Date of Patent: May 22, 2012

(54) COMPUTER CHASSIS FAN MODULES PROVIDING VIBRATION ISOLATION AND PINCH RELEASE

(75) Inventors: Brett C. Ong, San Jose, CA (US); Kenneth D. Shaul, Santa Clara, CA (US); Timothy W. Olesiewicz, Santa Clara, CA (US)

(73) Assignee: Oracle America Inc., Redwood City, CA (US)

( * ) Notice: Subject to any disclaimer, the term of this patent is extended or adjusted under 35 U.S.C. 154(b) by 806 days.

(21) Appl. No.: 12/331,732

(22) Filed: Dec. 10, 2008

(65) Prior Publication Data

US 2010/0142143 A1 Jun. 10, 2010

(51) Int. Cl.
*H05K 7/20* (2006.01)
*H05K 5/00* (2006.01)

(52) U.S. Cl. ............... 454/184; 361/695; 361/679.48
(58) Field of Classification Search .......... 454/184; 361/679.48, 695, 694; 415/213.1; 248/632, 248/634

See application file for complete search history.

(56) References Cited

U.S. PATENT DOCUMENTS

| | | | | |
|---|---|---|---|---|
| 4,767,262 A * | 8/1988 | Simon | ............... | 361/695 |
| 5,186,605 A * | 2/1993 | Tracy | ............... | 601/2 |
| 5,208,730 A * | 5/1993 | Tracy | ............... | 361/695 |
| 5,463,527 A * | 10/1995 | Hager et al. | ............... | 361/679.34 |
| 5,788,467 A * | 8/1998 | Zenitani et al. | ............... | 361/695 |
| 6,186,889 B1 * | 2/2001 | Byrne | ............... | 454/184 |
| 6,236,564 B1 * | 5/2001 | Fan | ............... | 454/184 |
| 6,351,380 B1 * | 2/2002 | Curlee et al. | ............... | 361/695 |
| 6,592,327 B2 * | 7/2003 | Chen et al. | ............... | 415/213.1 |
| 6,722,971 B2 * | 4/2004 | Gough | ............... | 454/187 |
| 6,854,737 B2 * | 2/2005 | Fieger et al. | ............... | 277/630 |
| 6,878,874 B2 * | 4/2005 | Osborn et al. | ............... | 454/184 |

(Continued)

FOREIGN PATENT DOCUMENTS

SU 429462 A * 10/1974

OTHER PUBLICATIONS

Noise-Reducing V-Bracket Fan Mounting, Oct. 1, 1987, IBM Technical Disclosure Bulletin, vol. 30, Issue 5, pp. 118-119; NN8710118.*

(Continued)

*Primary Examiner* — Steven B McAllister
*Assistant Examiner* — Phillip E Decker
(74) *Attorney, Agent, or Firm* — Marsh Fischmann & Breyfogle LLP; Kent A. Lembke

(57) ABSTRACT

A fan module for use with fan trays or decks within a computer chassis for forced-air cooling. The fan tray typically includes an elongated mounting post, and the fan module is configured to facilitate installation, retention, and removal such as with a single pinch release. The fan module includes first and second fan supports or frames housing cooling fans. The fan supports are spaced apart, and a bridge or living hinge member is positioned between the fan supports and acts to join the frames, e.g., in a resilient and pivotal/hinge manner. The bridge includes a body that is formed of an elastomeric material such as rubber. A retention groove is provided along one side of the bridge body and is configured for receiving and mating with the mounting post of the fan tray with its beveled or inward sloping sidewalls applying a spring or retaining force against the post sidewalls.

17 Claims, 9 Drawing Sheets

U.S. PATENT DOCUMENTS

| | | | |
|---|---|---|---|
| 7,118,334 B2* | 10/2006 | Winkler et al. | 415/213.1 |
| 7,494,408 B2* | 2/2009 | Chen et al. | 454/184 |
| 7,589,966 B2* | 9/2009 | Ong et al. | 361/695 |
| 7,599,175 B1* | 10/2009 | Ong et al. | 361/679.34 |
| 7,661,923 B2* | 2/2010 | Kosugi | 415/118 |
| 7,675,747 B1* | 3/2010 | Ong et al. | 454/184 |
| 7,684,191 B1* | 3/2010 | Willis et al. | 454/184 |
| 7,701,713 B2* | 4/2010 | Li | 361/695 |
| 7,914,366 B2* | 3/2011 | Miyamoto et al. | 454/184 |
| 2005/0113016 A1* | 5/2005 | Shen et al. | 454/184 |
| 2005/0280990 A1* | 12/2005 | Goodenough et al. | 361/695 |
| 2006/0192047 A1* | 8/2006 | Goossen | 244/17.23 |
| 2007/0242426 A1* | 10/2007 | Coster et al. | 361/687 |
| 2008/0062642 A1* | 3/2008 | Figuerado | 361/695 |
| 2010/0053893 A1* | 3/2010 | Willis et al. | 361/695 |
| 2010/0128457 A1* | 5/2010 | Ooya | 361/695 |

OTHER PUBLICATIONS

Fan Acoustic Isolators, Jul. 1, 1990, IBM Technical Disclosure Bulletin, vol. 33, Issue 2, pp. 233-234, NN9007233.*

* cited by examiner

COMPUTER CHASSIS FAN MODULES PROVIDING VIBRATION ISOLATION AND PINCH RELEASE

BACKGROUND OF THE INVENTION

1. Field of the Invention

The present invention relates, in general, to methods and systems for cooling electronic components such as processors in servers and other computing devices, and, more particularly, to a design for fan modules that facilitates installation into and removal from a computer chassis (e.g., a server chassis/box or the like) while also providing isolation of the operating fans from nearby computer components and/or the chassis.

2. Relevant Background

Removal of heat has become one of the most important challenges facing computer designers as failure to adequately cool devices can cause failure or operating problems. The rate of power dissipation from electronics components such as from processors (or CPUs) in high-performance server units continues to increase. In most cases, air cooling is used to remove heat from a heat generating surface of a CPU, a motherboard, and other components of the server or other computer/electronic product, with each chassis or box containing the heat generating components including one or more fans that draw air into the chassis or box to provide cooling and allow continued operation of the components.

An ongoing challenge for the design of cooling fans and fan modules is providing adequate retention within the server chassis while also allowing ready removal (e.g., hot swapping) for maintenance or replacement. Another challenge is to isolate the operation of the fans from the other components within the chassis. Specifically, it is desirable to isolate any vibrations generated by the fans from the motherboard or other portions of a server or computer. There remains a need for enhanced fan module designs that limit vibration transmission from cooling fans to a server or other computer chassis/box. Preferably, such fan module designs would also facilitate installation and removal of the fan modules from the chassis fan tray or deck while providing required module retention in a desired location.

SUMMARY OF THE INVENTION

Briefly, the above and other issues with prior fan module designs are addressed with a "pinch release" fan module described in the following paragraphs and shown in FIGS. 6-9. The fan modules taught herein incorporate an integrated living hinge or resilient bridge formed of an elastomer or the like positioned between and joining two spaced apart support frames or structures used to house or support cooling fans. The living hinge has a body that includes a groove (or post-mating slot) in a lower portion, and the resilient material of the body combined with the two-part fan frame allows the fans to be rotated outward during installation or removal of the module (e.g., by pinching the top of the fan support frames to compress an upper part of the hinge/bridge body while enlarging the groove). The module and/or bridge design may be thought of as providing a lever design or effect that increases a user's or technician's mechanical advantage in opening or enlarging the mounting groove to make fan removal and installation relatively easy and typically performable in a single motion and with one hand.

In some embodiments, the fan tray/deck post is provided with outward sloping or beveled sidewalls rather than simple vertical walls, and the groove is likewise beveled but in a reverse or mirror image manger with inward sloping sidewalls. In this manner, the sloped or beveled surfaces along with the resilient or spring nature of the elastomeric material used to form the hinge/bridge enable the hinge/bridge to apply adequate forces against the post to retain the fan module within the server chassis. Hence, the pinch release fan module retains the fan module when the pinching forces are released by the user/technician (e.g., the hinge/bridge is allowed to return to or near to its at rest position/shape once the module is positioned within the fan tray/deck), and the fan module also eliminates the vibration pathway of prior designs between the top of the module and the lid because the hinge/bridge maintains the module in its design position even under shock loading such that the lid may be spaced apart from the top of the fan module. As will be explained in more detail below, the fan modules of embodiments of the invention provide improved vibration isolation and also provide increased module retention within a chassis or box, whereas these functionalities were typically mutually exclusive goals in prior designs (e.g., retention often created a vibration transmission pathway). The fan modules provide intuitive removal and installation, while reducing problems with elastomeric materials adhering to mounting posts. The fan modules are also inexpensive to fabricate and are compatible with existing server and other computer chassis designs (e.g., have a similar size and shape and/or footprint for the fan chamber).

More particularly, a fan module is provided for use with fan trays or decks within a computer or electronics chassis for forced-air cooling. The fan tray typically includes an elongated mounting post or member on an upper surface, and the fan module is configured to facilitate installation, retention, and removal (such as with a single pinch release rather than twisting, rocking, and pulling as in prior designs). The fan module includes first and second fan supports or frames (e.g., rigid plastic frames/housings), and fans positioned within each fan support. The fan supports are spaced apart, and a bridge or living hinge member is positioned between the fan supports and acts to join the frames (e.g., in a resilient and pivotal/hinge manner relative to one end of the bridge). The bridge includes a body that is formed of an elastomeric material such as rubber. A retention groove is cut or provided along one side or end of the bridge body and is configured for receiving and mating with the mounting post of the fan tray.

In one embodiment, the mounting post is an elongated member with side walls extending outward or at an outward slope from the tray surface, and the retention groove has a non-rectangular cross sectional shape defined by inward sloping sidewalls extending from an open slot or mouth in the bridge body (e.g. the body and mounting post are arranged to provide a tongue and groove-type fit). Instead of sliding the groove over the post, though, the mounting post may be the same size or larger than the groove and the fan module is installed and removed by a lifting or vertical movement. Hence, the bridge body is configured with a quantity of the elastomeric material such that it can be compressed (e.g., by applying inward forces on a pair of spaced apart tabs on the first and second fan supports) to further open the groove to allow release/installation and then to apply a retaining force against the oversized mounting post such as to retain the fan module on the fan tray with an adhesive mating between the sidewalls of the groove and the mounting post. In this manner, the bridge may be thought of as a living hinge. To further this hinge functionality, the bridge body may also include a slot or planar opening extending from an upper sidewall of the groove upward into the bridge body, and, in some embodiments, the slot has a height (or extends a distance) that is greater than a height of the groove (e.g., up to twice the groove height or more) so as to define a hinge portion spaced apart from the groove and/or to allow less force to be used to generated the outward rotation of the fans.

DETAILED DESCRIPTION OF THE PREFERRED EMBODIMENTS

Figure 1:
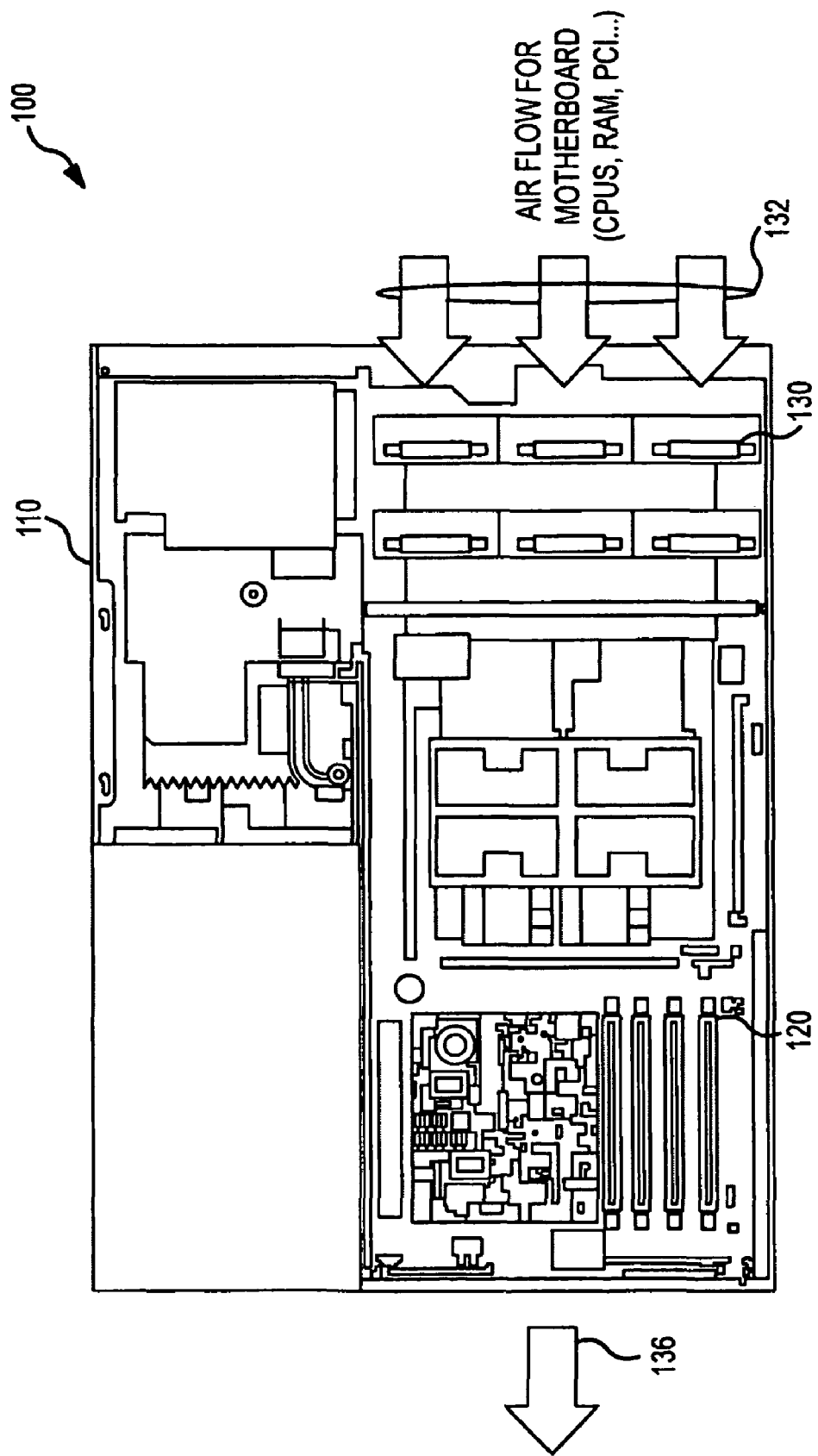
FIG. 1 illustrates a server with a lid of a chassis removed to show a set of cooling fan modules in a fan chamber of the chassis adjacent a motherboard/PCI.

FIG. 1 illustrates a server (or other computer system) 100 that is designed to use forced-air cooling. The lid of the server chassis 110 is removed to show a motherboard with processors and other electronic components 120 that require cooling during operation of the server 100. The chassis 110 may be divided into two chambers with the motherboard 120 placed in one chamber of the chassis along with a number of fans 130 (in a fan chamber). During operation of the server 100, the motherboard and other components 120 are cooled by redundant rows of fans 130 that are mounted to draw in cooling air 132 through a vented/open sidewall of the chassis 110 and eject the air 136 through another vented/open sidewall of the chassis 110 after it has been heated by the heat released from the motherboard and other components 120. Unfortunately, fans typically require maintenance or replacement during the service life of the cooled server or computer device as the fans may fail or operate ineffectively.

Figure 2:
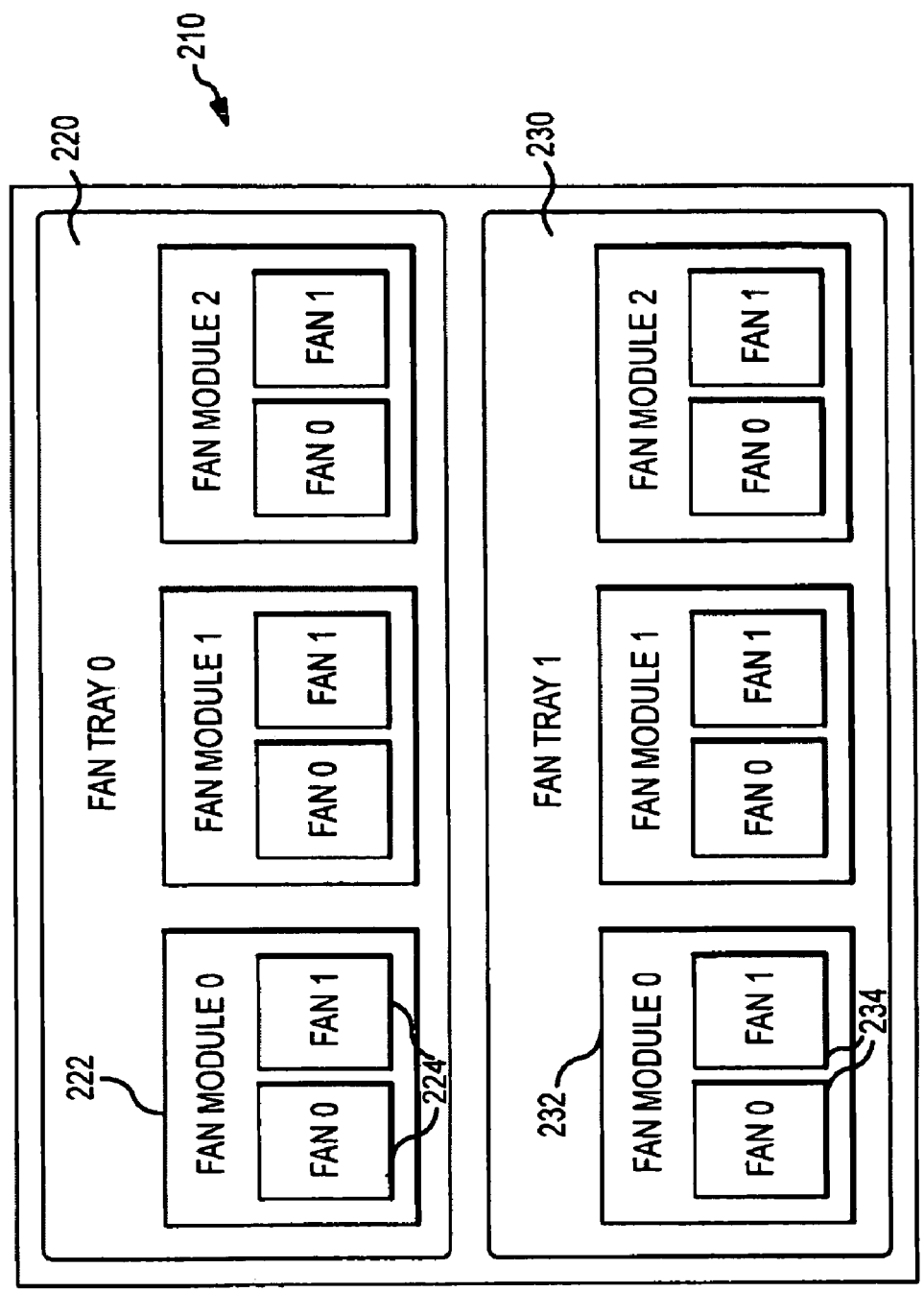
FIG. 2 is a functional block diagram of a server cooling fan system with a set of fan modules arranged in two rows in two adjacent trays to provide redundancy and facilitate hot swapping of the fans.

As shown schematically in FIG. 2, a cooling fan system 210 (e.g., as may be used to provide the fans 130 of FIG. 1 or the like) may be provided in a chamber in two or more fan trays 220, 230. The cooling fans 224, 234 may be provided in pairs within a number of modules 222, 232 with the fans 224, 234 positioned in two or more rows for redundancy (e.g., behind the front wall or bezel of the chassis). The fan modules 222, 232 may, of course, vary in configuration to provide cooling with a typical fan module being populated with or including a pair of 40 mm, 15000 RPM fans and with a chamber 210 typically including at least 4 but typically 6 or more modules 222, 232 (or 8 to 12 or more fans 224, 234 per server or computer product). The modules 222, 232 as well as the included fans 224, 234 are typically hot swappable with each fan module including an LED fault indicator to facilitate maintenance or replacement. The fans 224, 234 are accessible in many chassis designs from a hinged hatch door in the side of the server chassis or over the fan chamber 210. This arrangement makes it possible to access the fan modules 222, 232 without interrupting system operation, with maintenance or swapping typically involving removing one or more of the fan modules 222, 232 and inserting a new or a repaired module in its place.

Figure 3:
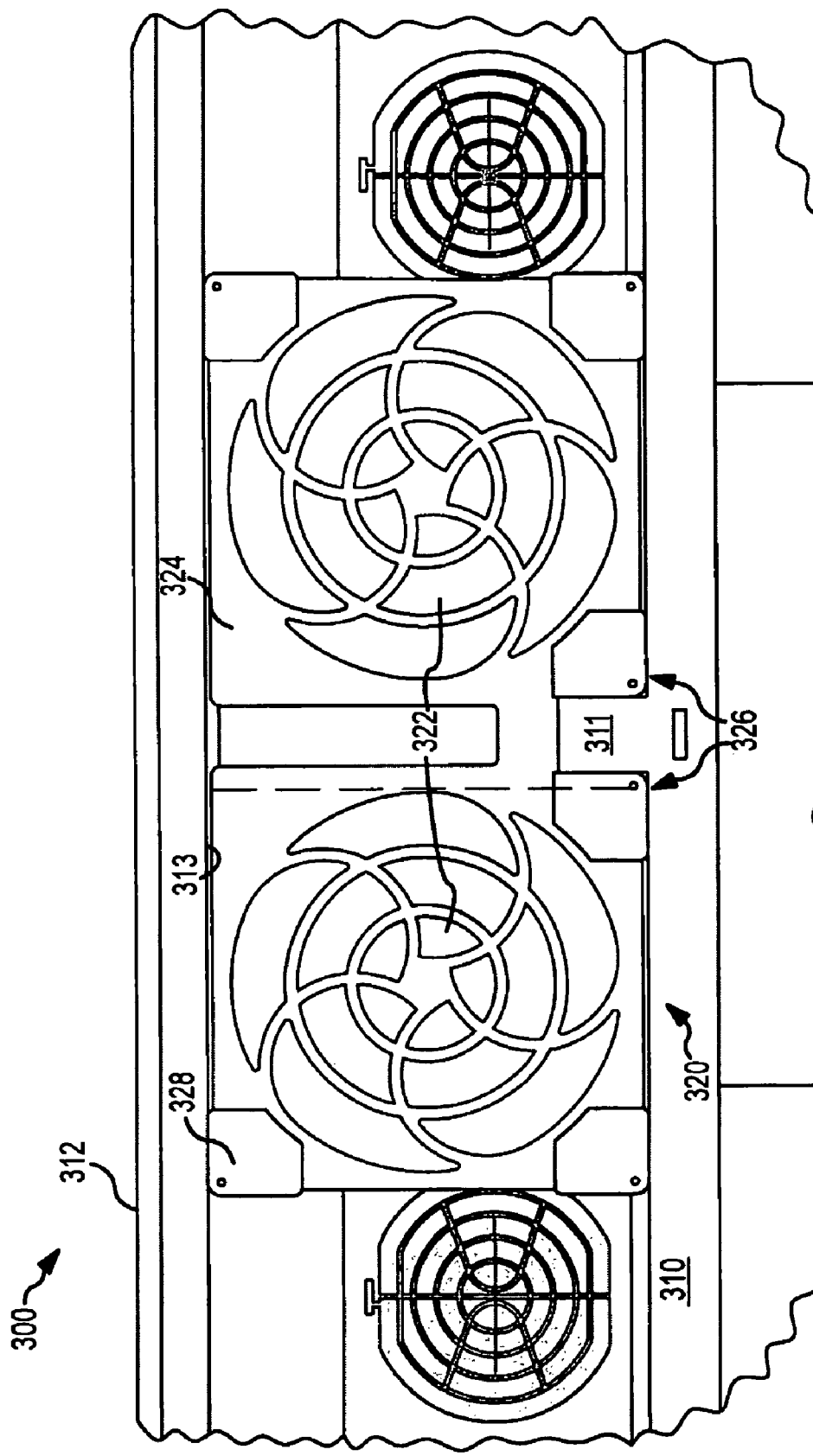
FIG. 3 is a perspective view of a prior art server chassis showing a fan module mounted to the server chassis.

An ongoing challenge for the design of cooling fans and fan modules is providing adequate retention within the server chassis while also allowing ready removal (e.g., hot swapping) for maintenance or replacement. Another challenge is to isolate the operation of the fans from the other components within the chassis. Specifically, it is desirable to isolate any vibrations generated by the fans from the motherboard or other portions of a server or computer. A portion of a server 300 is shown in FIG. 3 that includes a conventional fan module 320. The fan module 320 is mounted on the fan tray or deck 310 of the server box or chassis. In this particular example, the fan tray 310 includes a post 311 with a rectangular cross sectional shape that extends a length (e.g., a few inches or the like) along the tray surface. The fan module 320 includes a frame or support structure 324, such as a hard plastic frame, to rigidly support and position a pair of cooling fans 322 in a side-by-side manner.

Figure 4:
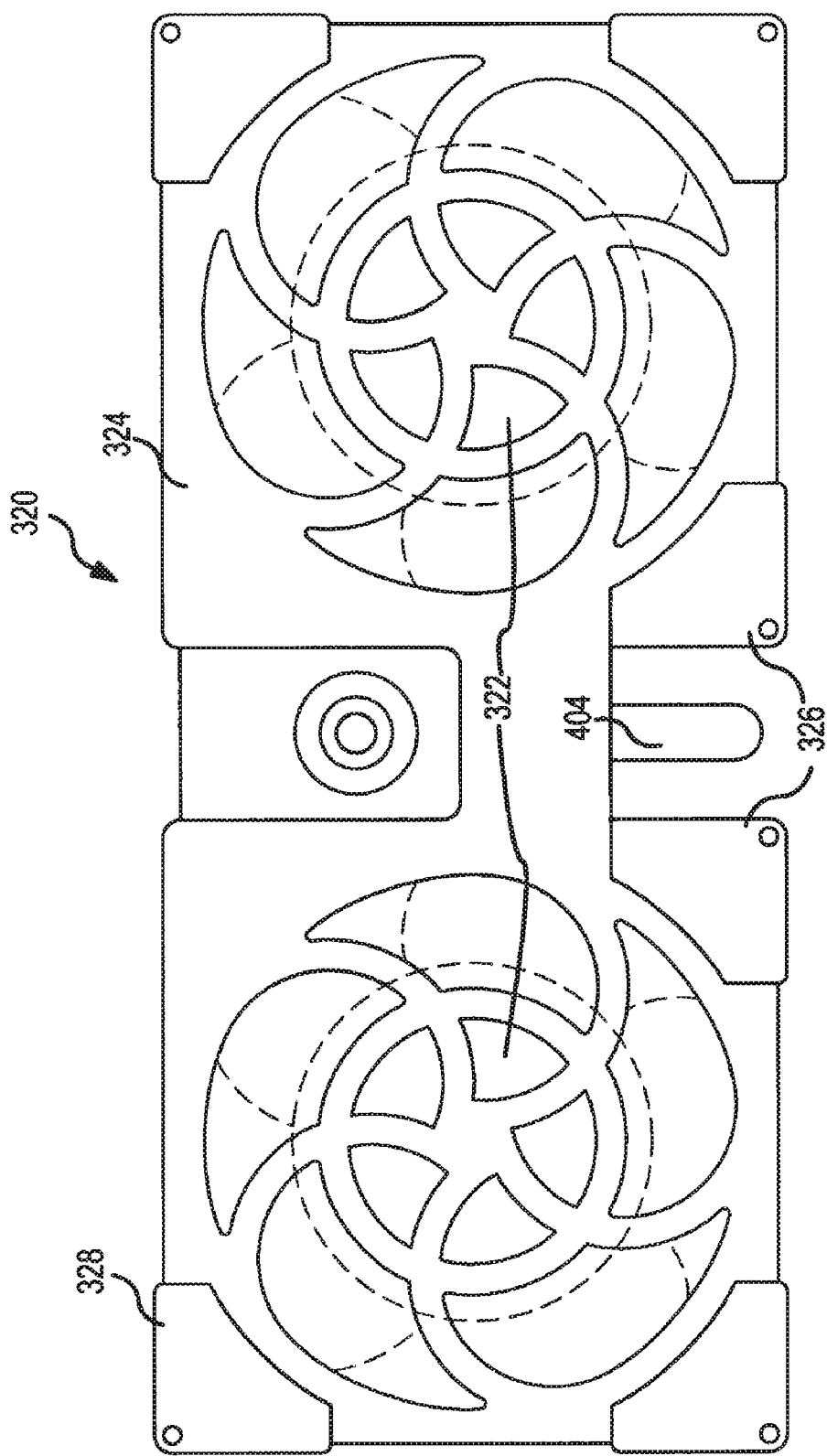
FIG. 4 is a front or end view of the prior art fan module shown in FIG. 3 prior to installation in the server chassis.

To retain the fan module 320 on the fan deck 310 (or within chassis of server 300) internal corner members 326 are provided that are spaced apart about the width of the post 311 or a somewhat smaller amount such that the frame 324 is press fit or compression fit onto the post 311 with a downward installation force. The internal corner members 326 are typically formed of an elastomeric material such as a rubber such that they can be compressed at least some amount when they are forced into abutting contact with the sides of the post 311. FIG. 4 shows the fan module 320 removed from the server 300 showing the corner members 326 in an uncompressed or at rest position. FIG. 4 also shows that the fan module 320 may further include a pin or dowel 404 that extends outward from the frame 324 between the corner members 326 and is provided to mate with a hole or recessed surface in the fan deck 310 or post 311 to facilitate aligning or positioning each fan module 320 in a fan chamber of a server 300.

Figure 5:
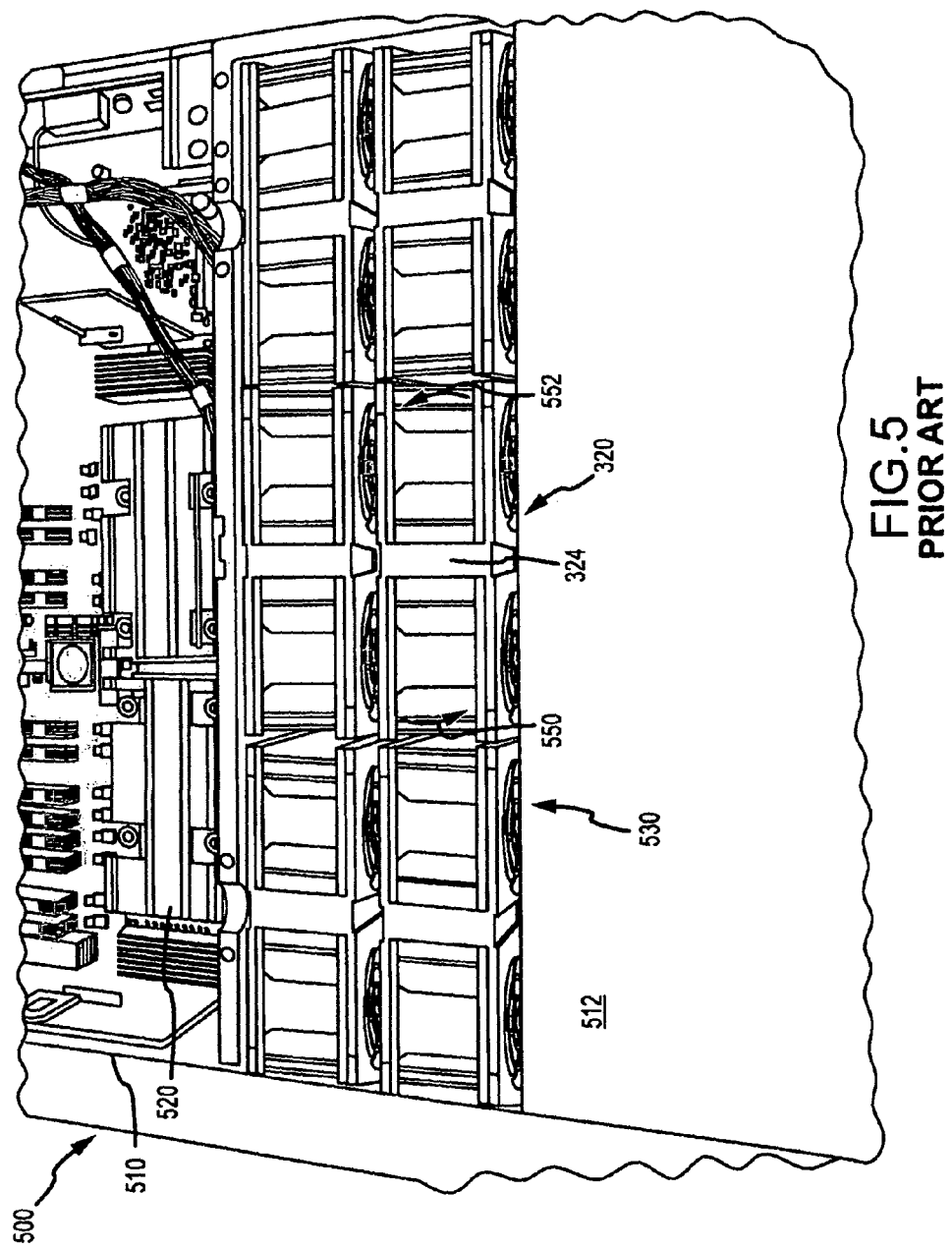
FIG. 5 is a top view of the server of FIG. 3 with the lid removed to show two rows of fan modules each containing a pair of fans and showing with arrows a twisting movement required to release and remove the fan modules from the fan chamber of the server chassis.

The elastomeric corners 326 provide vibration damping between the fans 322 and the post 311 as well as a compression fit to retain the fan module 320. Elastomeric upper and/or outer corners 328 may also be provided on the fan module 320 because the inner corners 326 typically do not provide adequate retention of the module 320 against the fan deck 310, e.g., the module 320 may vibrate up off the post 311 if retention was provided solely by inner corner members 326 or move under a shock loading such as during shipping. Instead, the chassis lid 312 is utilized to apply a retaining force with inner surface 313 against the module frame 324 to hold the fan module 320 in place, and the elastomeric outer corner members 328 are used to provide at least some vibration isolation to try to overcome the problem with physically linking the chassis to the fans 322 via lid 312 (e.g., attempt to lessen the negative impact of a direct vibration path to the server chassis). FIG. 5 illustrates a server 500 with a chassis 510 in which server components 520 are positioned adjacent a fan chamber 530 with six fan modules 320 (with the lid 512 in the open position or fan-hot swap/access position).

A number of problems are caused by the conventional fan module design shown in FIGS. 3-5. As discussed and shown, elastomeric damping material is used in the server fan modules 320 to provide vibration damping and is also used in the fan module retention members (e.g., corners 326). While softness and compliance of the elastomeric components is useful for vibration damping, the material typically adheres to the surfaces of the post 311 and/or fan deck 310. The adhesion to the surfaces assists in retention such as when shock loading is a concern, but it also can make it more difficult to remove the fan modules 320 for replacement or maintenance. Further, the adhesion forces or friction forces are increased between the post 311 and the inner corner members 326 due to the use of press or compression fit. FIG. 5 illustrates with arrows 550, 552 the twisting forces that a technician will typically have to apply via frame 324 to remove the fan module 320 from chamber 530. The module retention forces provided by the inner corners 326 can be difficult for the technician to overcome as application of the twisting force 550, 552 to break the adhesive bond is not intuitive and may have to be applied concurrently with a lifting force on frame 324. Hence, serviceability and hot swapping is negatively impacted.

Briefly, embodiments of the present invention are directed to fan modules for use in cooling electronic components within a chassis or box such as a computer system/server. For example, the fan modules described below and in FIGS. 6-9 may be used as the fan modules of the servers and/or fan chambers 100, 210 of FIGS. 1 and 2. In place of a single, rigid frame or fan support, embodiments of fan modules include a pair of rigid fan supports (e.g., a right and a left fan support or frame), and, significantly, an elastomer bridge or living hinge is positioned between the two fan frames. The elastomer bridge includes a post retention or mating groove at a lower or base end that is adapted to mate with a fan tray or deck mounting post. This groove combined, in some cases, with an elongate slot extending in a center-portion of the bridge body from the groove allows the bridge to function as a hinge about which the fans can be rotated outward. Specifically, a pair of tabs or lever arms may be provided that extend outward from upper, outer edges of the fan frames such that during installation a technician may apply inward forces on the two tabs causing the upper portion of the bridge body to compress while the lower portion or base of the bridge body is opened up or expanded (e.g., the mounting groove and hinge slot are spread apart or have their walls further spaced apart).

In this installation or removal position, the fan module can readily be moved in and out of the fan chamber and placed on (or taken off) of the fan tray/deck mounting post. Retention is enhanced in some embodiments by modifying the fan tray/deck mounting post to have a non-rectangular cross section such as a cross section including outward sloping sidewalls as measured from the fan deck/tray surface (or beveled edges/sides). The retention or mounting groove of the bridge may have a matching cross section with a reverse or mirror cross section with sidewalls that are inward sloping or beveled (as measured from an upper portion of the bridge body). When the pinching or installation force is released, the bridge body tries to return to its "at rest" position which causes the sloped or beveled sidewalls of the retention groove to mate with the oppositely sloped or beveled sidewalls of the mounting post. In this manner, the elastomer bridge acts to retain the fan module even under shock loads as the groove sidewalls adhere to the mounting post of the fan tray/deck (e.g., resist lifting movements as well as end-to-end movements). Due to this effective retention at the mounting tray, the fan module may be spaced apart from the fan chamber cover or lid to eliminate a vibration transmission path found in prior fan module designs.

As discussed in the background, forced-air cooling with fans is required for many electronic components and devices/systems using such systems. For example, but not as a limitation, the electronic components may be high performance CPU or similar component for a computer or computing device such as a server or data storage computer system. For purposes of this disclosure, a "server" may include nearly any computer system and electronic component providing instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, a "server" in this sense may be a computer system or electronics device/product such as a personal computer, a network storage device, or any other suitable device and may vary in size, shape, performance, functionality, and price. These computer systems may include random access memory (RAM), one or more processing resources such as a central processing unit (CPU) or hardware or software control logic, ROM, and/or other types of nonvolatile memory, and the CPU and/or other electronic components may be adapted for passive cooling with a heat sink(s) of the present invention. Additional components of the system may include one or more disk drives, one or more network ports for communicating with external devices as well as various input and output (I/O) devices, such as a keyboard, a mouse, and a video display. The computer systems and/or servers may also include one or more buses operable to transmit communications between the various hardware components. Cooling for these computer or server components is provided with embodiments of fan modules taught herein with improved vibration isolation and/or enhanced installation and removal (e.g., with a "pinch release" design).

Figure 6:
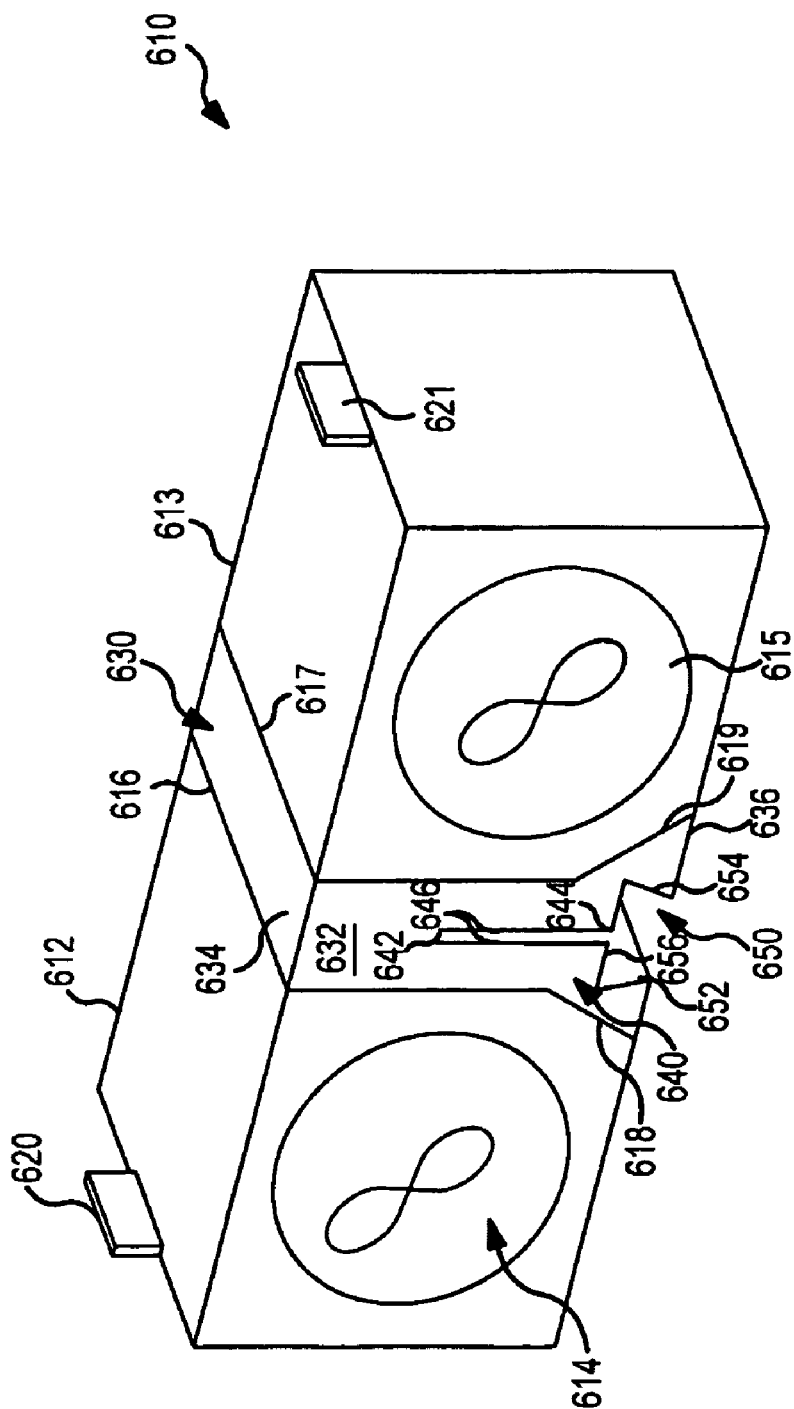
FIG. 6 is a perspective view of one embodiment of a fan module including a resilient bridge (or living hinge) positioned between spaced apart fan support frames.

In one embodiment illustrated in FIG. 6, a fan module 610 is provided that includes a pair of spaced apart fan frames 612, 613. The frames 612, 613 may be formed of plastic or another relatively rigid material and each functions to support and position a fan 614, 615 (e.g., a pair of 40 mm, 15,000 RPM fans or other cooling fans typically used for cooling servers and other computer/electronics products with the specific size and design of the fan 614, 615 not being limiting of fan module). The frames or fan housings 612, 613 have exterior walls 616, 617 that are spaced apart with a bridge or living hinge 630 of an embodiment of the invention positioned therebetween. Also, although not required, the walls 616, 617 have an upper portion that is substantially vertical such this portion of the walls 616, 617 is parallel in the assembled module 610, and the walls 616, 617 also include a lower or base portion 618, 619 that is angled inward. This arrangement of the lower wall 618, 619 facilitate facilitates receipt of the bridge 630 and, more significantly, allows the bridge 630 to have a greater width proximate to or adjacent to a retention or mounting groove 650 (e.g., provide a mass of elastomeric material for isolating vibration from the frames 612, 613 to minimize transfer to a mounting post on a fan tray or deck). The frames or housings 612, 613 each also include one or more tabs or levers 620, 621 on an upper (and typically outer) surface (e.g., spaced apart from surfaces 616, 617) that provide locations or surfaces for a technician to apply a force that activates the hinge or bridge 630 by spreading apart or enlarging the groove 650 to allow the module 610 to be removed or installed on a fan tray/deck post.

Figure 7:
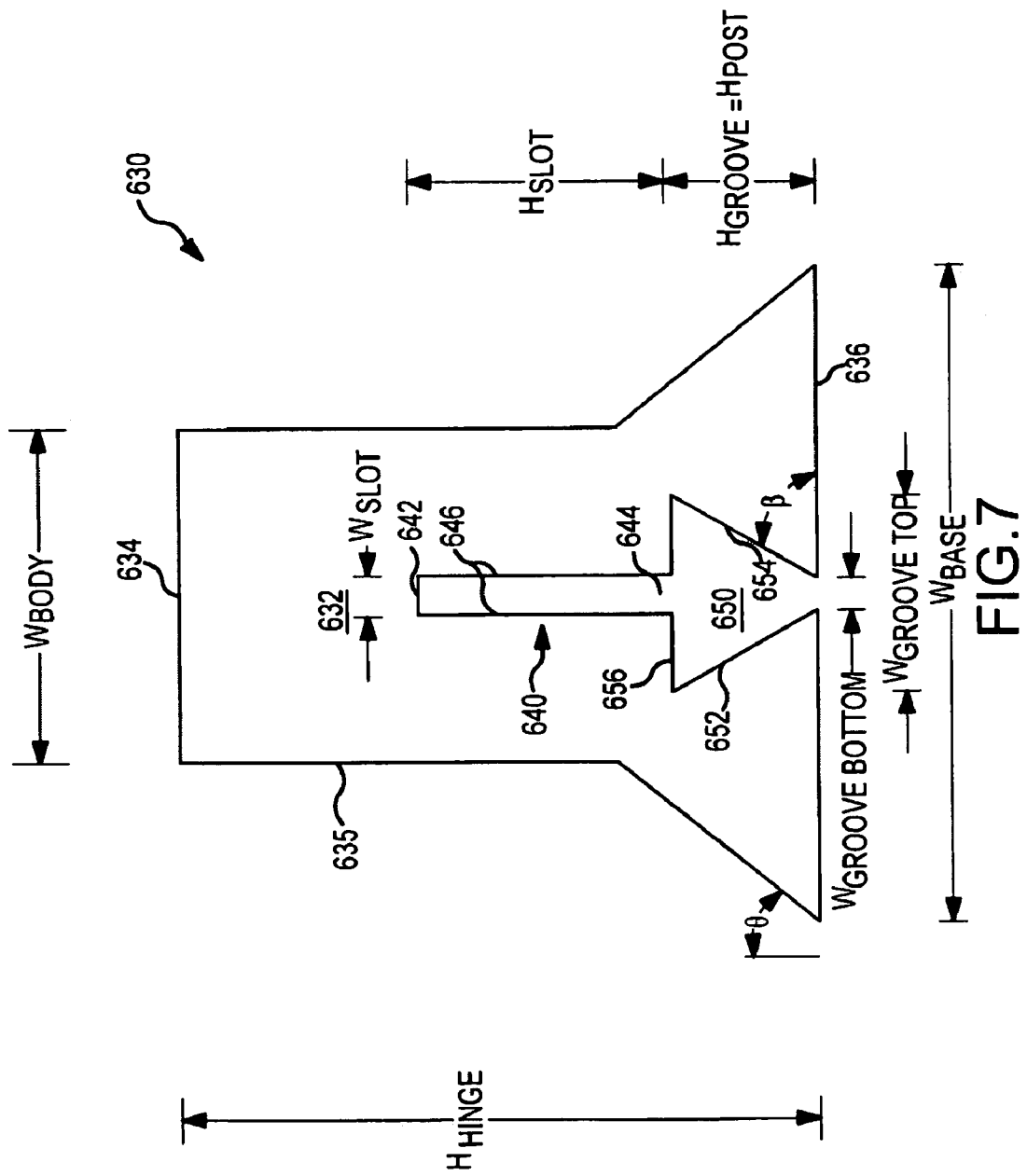
FIG. 7 is side or end view of the resilient bridge of the fan module of FIG. 6 showing features of the bridge or hinge in more detail.

The bridge 630 is typically formed of an elastomeric material or material that provides a desired amount of resiliency such that the bridge 630 functions to dampen vibration (e.g., between fan frames 612, 613 and a post) and also create a resilient or spring force as it returns to an "at rest" position (as shown in FIGS. 6 and 7). In other words, the bridge 630 may be deformed during installation and removal of the module 610 and when a deforming force is removed (e.g. a pinching force is removed from tabs 620, 621) the material of the bridge 630 tries to move back to its original or pre-deformation configuration, which provides a retaining force when the module is installed with a post in the groove 650. A wide variety of elastomers may used such as unsaturated rubbers (e.g., natural rubber, synthetic polyisoprene, butyl rubber, polybutadiene, styrene-butadiene rubber, nitrile rubber, choloroprene rubber, and the like), saturated rubbers (e.g., EPM rubber, EPDM rubber, silicone rubber, polyacrylic rubber, and the like), thermoplastic elastomers, thermoplastic polyurethane, thermoplastic olefins, and the like, with the specific elastomer chosen to form the body 632 of bridge 630 depending on design parameters such as desired hardness, spring force, size of bridge 630, and so on. In one embodiment, the bridge 630 (or portions of the bridge) are formed of composite materials such as solid vinyl, thermoset materials, or the like, e.g., as available from E-A-R Specialty Composites (e.g., the ISODAMP C-1002, C-1105, or 0-1100 product line, the ISOLOSS HD product, the ISOLOSS SL-20100 or SL-25200 product line, or the like) or from similar material producers or distributors.

The bridge 630 includes a body 632 with an upper side or end 634 and a lower side or end 636. The bridge body 632 is sandwiched between the frame sidewalls 616, 617, with the upper side 634 being coplanar with upper surfaces of the frame 612, 613 and the lower side 636 being coplanar with lower surfaces of the frame 612, 613 (e.g., to rest upon a planar fan tray upon installation of the module 610). The bridge 630 may be attached to the walls 616, 617 in any of a number of methods including adhesive to provide a permanent bond. The bridge 630 includes a retention groove 650 formed in the base 636 of the body 632. The groove 650 generally is formed for mating with a fan tray mounting post and may have a rectangular cross section to suit conventional posts. More preferably, the post may be beveled and the groove 650 include a pair of spaced apart sidewalls 652, 654 that are also beveled or inward sloping from a top or upper mating surface 656. In use, the sidewalls 652, 654 contact the sidewalls of the tray post while the upper surface 656 abuts the top surface of the post. The groove 650 generally will extend the entire length (or depth) of the bridge body 632 (e.g., a single fan post may be used to mount two or more fan modules and the bridge groove 650 will attach along one length or portion of the fan tray post). The bridge body 632 further includes an elongate and substantially planar or narrow slot 640 extending upward from the groove's upper or top wall 656. The slot 640 has an upper end or top sidewall 642 in the body 632 that is spaced apart a distance from the groove 650, a pair of spaced apart sidewalls 646, and a lower end 644 that opens to the groove 650 in the groove upper or top wall 656. The slot 640 is provided to facilitate or further enable the hinge action provided by the bridge 630 by allowing a wider separation of the groove walls 652, 654 and/or requiring less force (e.g., on tabs 620, 621) to rotate the fans 614, 615 outward.

FIG. 7 illustrates an end view of the bridge or living hinge 630 showing more of the aspects of the bridge 630. As shown, the body 632 is substantially rectangular in an upper portion proximate to upper end/surface 634 and has a width, $W_{body}$, as measured between two sidewalls 635 (which abut the fan frames 612, 613 at surfaces 616, 617). The width or thickness, $W_{body}$, of the body 632 may vary to practice the invention but typically is 0.5 to 1 cm or more. The height, $H_{hinge}$, of the body 632 may also be varied to practice the invention but will typically will match the height of the fan frame 612, 613 such as 40 to 80 mm or more. In some cases, though, the upper edge or surface 634 may be below the top edge of the fan frame upper surface (e.g., the surface/edge 634 may be recessed from the tops of sidewalls 616, 617). Near the base 636 of the hinge body 632, the sidewalls 635 may be sloped or beveled at an angle, θ, (e.g., 30 to 60 degrees or the like) to mate with similar sloped or beveled corners 618, 619 of the frames 612, 613. Such an arrangement provides additional elastomeric materials of the body 632 available to structurally support groove 650 and provide adequate vibration damping and adhesion/retention forces with the width, $W_{base}$, exceeding the width, $W_{body}$, of the top or upper portion of body 632 (e.g., when the top of the body 632 is 1 cm the base may be 1.5 to 3 cm or some other ratio). However, in other embodiments the walls 635 are planar from top 634 to bottom/base 636 and the width, $W_{body}$, is increased to support a desired size of groove 650 (e.g., the width of the body may be 2 cm to support a 1 cm groove or the like). The length or depth of the body 632 (as measured into the page of FIG. 7) typically will match the dimensions of the frame 612, 613 (such as 20 to 60 mm or the like) or be somewhat smaller (or even larger) than the frame 612, 613 in some cases.

The hinge functionality of the bridge 630 is provided in part by the compressible nature of the elastomeric material in the body 632 in the solid portion near top edge 634. During use, the width, $W_{body}$, near surface 634 may be reduced by application of pinching or compressive forces or the surface 634 may lose its planar configuration and become curved (e.g., similar to a book spline when the book is opened for reading). More significantly, the inclusion of the retention groove 650 furthers the hinging action of the body 632 under compressive forces near or along surface or upper sidewall 634 because the pinching or compression at sidewall 634 causes expansion of the body 632 near base sidewall 636 and opening of the groove 650. The groove 650 may have a rectangular cross sectional shape (not shown) to mate with a conventional tray post. As shown, though, the groove 650 has a cross sectional shape with inwardly sloping or beveled sidewalls 652, 654 as measured by angle, β, (e.g., a few degrees to 20 to 45 degrees or more) from a top or inner mating surface 656 within the body 632. This results in the cross section of the groove 650 shown with a width, $W_{groove\ opening}$, of the groove 650 opening, bottom, or mouth that is less than a width, $W_{groove\ top}$, of the groove 650 inner surface or top (e.g., the width of top or inner mating surface 656). For example, the width, $W_{groove\ opening}$, may be 10 to 50 percent smaller than width, $W_{groove\ top}$. The slope allows the sidewalls 652, 654 to more easily fully retain the fan module against a mounting post of the fan tray. The groove 650 also is defined by a height, $H_{groove}$, that is measured from the base edge 636 of the body 632 to the top or inner groove mating surface or sidewall 656, and this height is typically about equal to the height, $H_{post}$, of the mounting post on the fan tray or deck. During compression, the width, $W_{groove\ opening}$, is increased as the sidewalls 652, 654 are spaced further apart in the hinging action of the bridge 630.

In some embodiments, as shown, the hinging functionality is further enhanced (with less force) by providing the hinging slot 640. The slot 640 extends from an end 644 that is open to the groove 650 (from wall 656) to an end sidewall 642 deeper within the body 632. The slot 640 is defined by sidewalls 646 that are typically planar walls that are spaced apart a slot width, $W_{slot}$ (e.g., a few millimeters) and have a height, $H_{slot}$, which may vary widely to practice the invention but may be at least about as great as the groove height, $H_{groove}$, and more typically 1.5 to 2 or more times greater than the groove height, $H_{groove}$. The slot 640 may be relatively narrow to support a relatively significant hinging function of the body 632, and the slot height, $H_{slot}$, is chosen to set a location (e.g., near the wall 642) where the hinging may occur more readily and also to set a desired spring or retention force (e.g., a taller slot 640 may act to reduce the spring force urging the sidewalls 652, 654 against sides of a mounting post).

Figure 8:
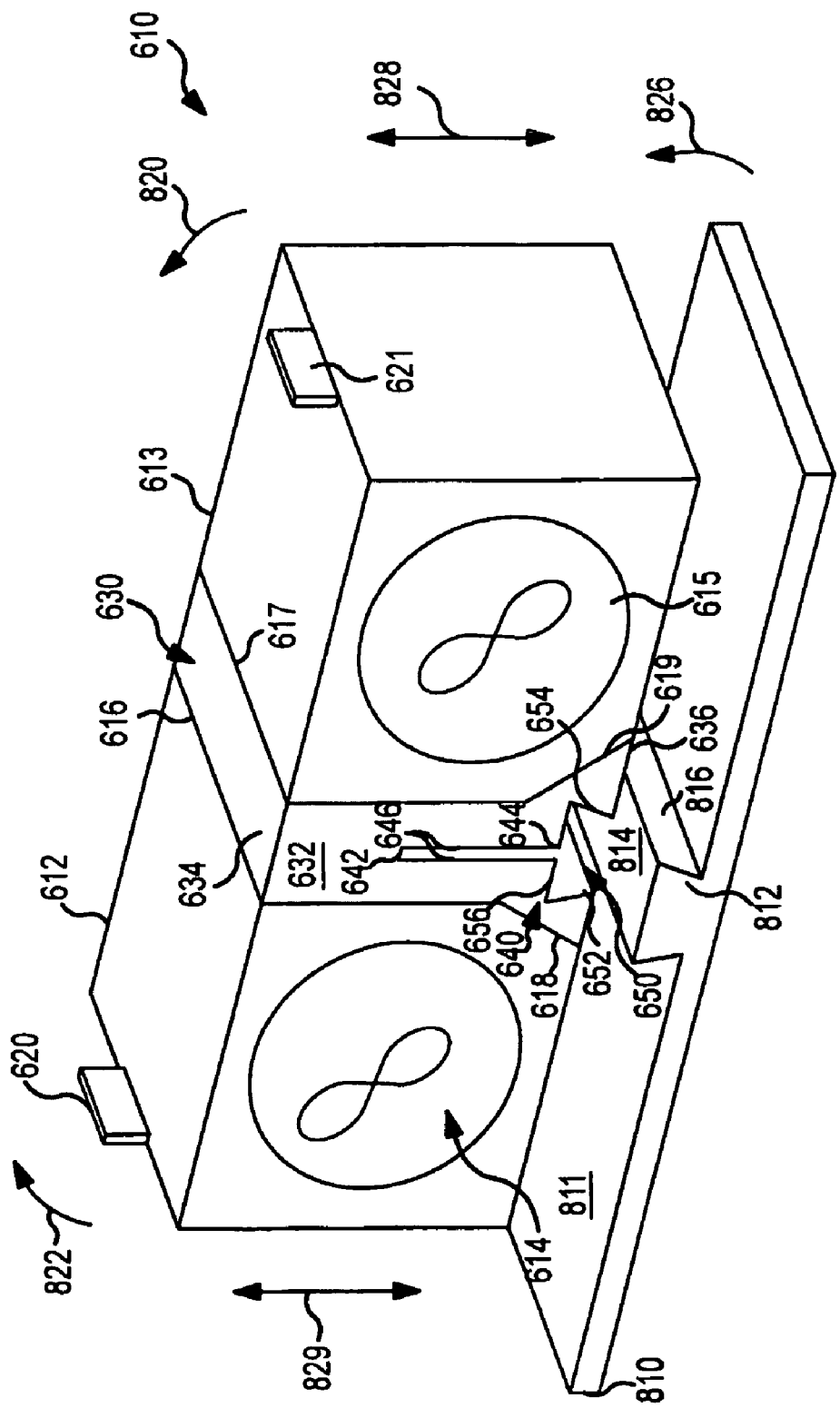
FIG. 8 is a perspective view of the fan module of FIG. 6 during installation or mounting onto (or removal from) a fan tray or deck such as may be provided within a server (e.g., the server of FIG. 1 or the like) with a retention groove in the bridge body shown in an expanded or opened position for receiving a post, which has outwardly sloping sidewalls.

FIG. 8 illustrates a fan module 610 during installation or removal from a fan deck or tray (e.g., within a fan chamber of a server or other electronics component chassis/box). The fan deck 810 includes an upper receiving or support surface 811 for the fan module 610 and an elongated fan mounting post 812 is shown to extend a length on this surface 811. In some embodiments, the post 812 is rectangular as in conventional fan trays. In others, as shown, the post 812 has a pair of sloping or beveled sidewalls or edges 816 that angle outward from the post body or from the surface 811 to an upper post mating surface 814. To install (or remove) the module 610, a compression or a pinching force is applied as shown with arrows 820, 822 to the tabs 620, 621, which compresses the bridge 630 near end 634 and expands or enlarges slot 640 and groove 650 causing the fans to rotate outwards as shown with arrow 826. With the module 610 in the install/remove position, the module 610 may be moved toward or away from 828, 829 the fan tray surface 811 as the groove 650 is larger or wider than the post 812 without the groove sidewalls 652, 654 contacting the post sidewalls 816. Hence, fan module installation and removal can be performed with one hand (as the fan module 630 may be about one bandwidth from tab to tab) and in a substantially singular motion of squeezing tabs 620, 621 together as shown at 820, 822 with concurrent lifting or lowering 828, 829 of the module 610 relative to fan tray 810.

Figure 9:
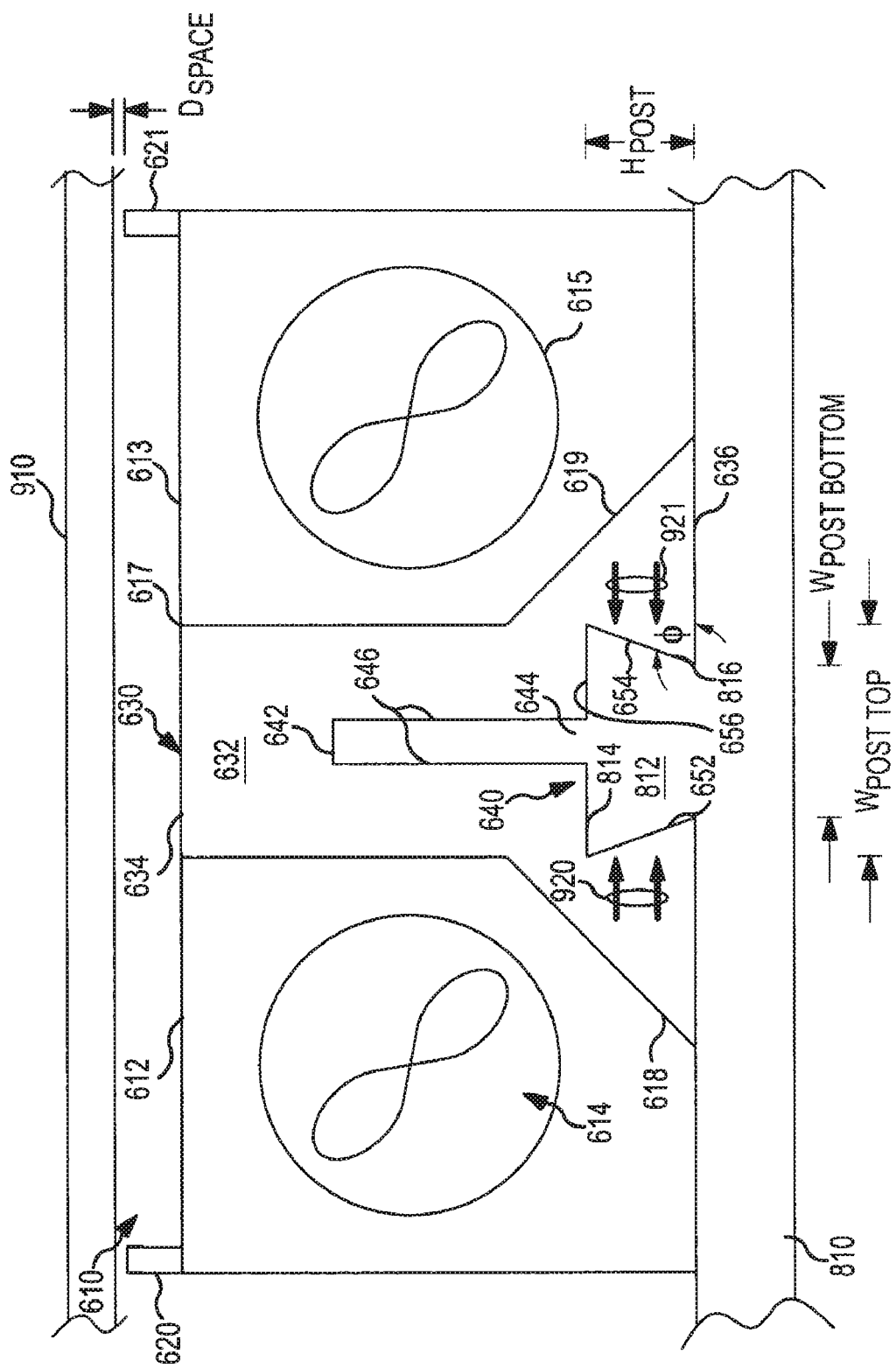
FIG. 9 is a side view of the fan module after installation or mounting within the server chassis showing mating of the retention groove sidewalls with the sidewalls of the tray/deck post and also showing a space between the chassis or fan chamber lid and the fan module (which eliminates a vibration transmission pathway).

FIG. 9 illustrates the fan module 610 after installation upon the tray 810 and after a lid or cover 910 to a fan chamber and/or chassis has been installed. As shown, the compressive forces 820, 822 have been released and the bridge 630 has returned to its "at rest" position (or nearly to such a position as the post 812 may prevent complete relaxation of the elastomeric materials of the body 632). The fan tray mounting post 812 is shown to have an upper or top mating surface 814 that defines a width, $W_{post\ top}$, of the post 812 cross sectional shape. Typically, the width, $W_{groove\ top}$, of the groove 650 will be substantially equal to this post dimension, and the groove top sidewall 656 mates with the surface 814 of the post 812. In the installed position, the body 632 may be in or near its at rest position with the slot 640 having its original width, $W_{slot}$, or a slightly larger width. The sidewalls 652, 654 come into abutting contact with the sidewalls 816 of the post 812 and apply as shown at 920, 921 a retaining force that causes the elastomeric material to adhere to the post 812. The width, $W_{post\ bottom}$, of the bottom of the post 812 may be the same as the at rest width, $W_{groove\ bottom}$, of the groove 650 or somewhat larger to ensure adequate interaction or mating between the body 632 and the post 812. Also, as shown, the sidewalls 816 of the post 812 are sloped or beveled outward from the post body as shown with angle, $\Phi$, which typically will be substantially equal to or some relatively small amount larger than the slope, $\beta$, of the groove sidewalls 652, 654. The inward forces 920, 921 act to retain the fan module 610 in a desired position against the mounting post 812, e.g., with a tongue and groove joint that effectively resists lifting of the module 610 off of the post 812 without application of spreading/release forces 820, 822.

Hence, there is no need for the lid or cover 910 of the chassis (or fan chamber) to apply a retention force as was the case with prior fan module designs. As shown, the tabs 620, 621 or upper portions of the fan module 610 are spaced apart a distance, $d_{space}$, (e.g., up to 1 mm or more) from inner surfaces of the lid or cover 910. The installed module 610 provides improved vibration isolation from the chassis since there is no direct contact between the frames 612, 613 and the lid 910. Further, elastomer corners on upper surfaces of the fan module are not required, but such corners may be provided if the module 610 is placed in a chassis in which the lid 910 contacts the top of the module (or the bridge 630 may extend outward to allow the lid to first contact the elastomeric material of the body 632 at upper surface 634).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A fan module for use with a fan tray having a mounting post and facilitating installation, retention, and removal of a pair of cooling fans, comprising:
   a first fan support;
   a second fan support spaced apart from the first fan support;
   a fan positioned within each of the fan supports; and
   a bridge positioned between and joining the first and second fan supports, wherein the bridge comprises a body formed of an elastomeric material, the bridge body including a retention groove for receiving the mounting post of the fan tray, wherein the joining is provided by the bridge body attached to a first sidewall on the first fan support and a second sidewall of the second fan support that is spaced apart from the first sidewall, and wherein the bridge body extends from an upper end to a lower end of each of the first and second sidewalls, and wherein the retention groove has first and second walls angled away from each other from a bottom end of the groove to a top end of the groove.

2. The fan module of claim 1, wherein the mounting post is an elongated element extending a length on the fan tray with sidewalls sloping outward at an angle as measured from normal to the fan tray.

3. The fan module of claim 2, wherein the retention groove extends the length of the bridge body and has a non-rectangular cross sectional shape defined by inward sloping sidewalls extending from an open mouth in the bridge body.

4. The fan module of claim 3, wherein the cross sectional shape of the retention groove substantially matches a cross sectional shape of the mounting post taken orthogonal to a longitudinal axis of the mounting post.

5. The fan module of claim 1, wherein the bridge body further comprises a slot extending from an upper wall of the groove into the bridge body.

6. The fan module of claim 5, wherein a height of the slot as measured from the upper wall of the groove is greater than a height of the groove.

7. The fan module of claim 1, further comprising a first tab on an upper surface of the first fan support located distal from the bridge and a second tab on an upper surface of the second fan support located distal from the bridge, whereby the bridge body functions as a hinge when a pair of forces directed generally toward the bridge are applied to the tabs causing the groove to expand in width to receive the mounting post.

8. The fan module of claim 1, wherein the received mounting post has a cross sectional size that is at least as large as a cross sectional size of the retention groove and wherein the bridge body comprises a quantity of the elastomeric material applying retention forces against the mounting post with sidewalls of the retention groove as the bridge body attempts to return to an at rest position upon removal of a previously applied compressive force.

9. A server adapted for forced-air cooling, comprising:
- a chassis including a fan deck with a plurality of elongated mounting posts extending from an upper surface of the fan deck; and
- a fan module with a pair of spaced-apart housings each supporting a cooling fan and with a bridge with a body formed from an elastomer, the bridge body being sandwiched between the housings and including an elongated groove on an exposed side of the bridge body receiving one of the mounting posts,
- wherein the bride body is attached to a sidewall of each of the fan housings and the fan module further comprises a pair of tabs extending outward from upper outer edges of each of the fan housings, whereby the groove is enlarged when a compressive force is applied to the tabs,
- wherein the mounting posts each include a pair of sidewalls with an upper mating surface extending between ends of the sidewalls, and
- wherein the sidewalls are angled outward from a normal to a surface of the fan tray.

10. The server of claim 9, further including a cover for the chassis extending over the fan deck, wherein the cover is spaced apart from the fan module when the fan module is retained by the groove on the mounting post.

11. The server of claim 9, the bridge body further comprising a slot extending upward from an upper sidewall of the groove into the bridge body.

12. A fan module for providing air cooling in a fan chamber of a computer chassis, the fan chamber including a fan tray with an elongated mounting post with outwardly angled sidewalls, comprising:
- a pair of rigid fan support structures each supporting a cooling fan;
- a hinge member sandwiched between and attached to sidewalls of the fan support structures, the hinge member comprising an elastomer body;
- an elongated retention groove defined in the elastomer body by a pair of sidewalls and an upper surface extending between ends of the sidewalls of the groove, wherein the groove has a cross section substantially corresponding in shape to a cross section of the mounting post with outwardly angled sidewalls; and
- a slot in the elastomer body extending from the upper surface of the groove into the elastomer body a distance exceeding a height of the groove.

13. The fan module of claim 12, wherein a width of a base of the mounting post is at least about a width of a bottom of the groove, whereby when installed in the fan tray the elastomer body applies a retaining force against the mounting post with the sidewalls of the groove abutting the beveled sidewalls of the mounting post.

14. The fan module of claim 12, wherein the sidewalls are sloped inward from the upper surface at an angle of at least about 15 degrees.

15. The fan module of claim 12, wherein the elastomer body has a width of at least about 0.5 cm.

16. The fan module of claim 12, wherein an upper end of the slot within the elastomer body is spaced apart from an upper sidewall of the elastomer body by at least 1 cm, whereby a mass of elastomeric material is provided distal to the groove to generate a spring force to retain the fan module upon the mounting post of the fan tray.

17. The fan module of claim 12, further comprising a lever arm member extending from each of the fan support structures proximate to an edge distal to the sidewalls attached to the hinge member, whereby a compressive force concurrently applied to the lever arm members urges the sidewalls of the groove further apart allowing receipt of the mounting post within the groove.

* * * * *